US011335869B2

(12) United States Patent
Woo et al.

(10) Patent No.: US 11,335,869 B2
(45) Date of Patent: May 17, 2022

(54) DISPLAY DEVICE AND METHOD OF MANUFACTURING THE DISPLAY DEVICE

(71) Applicant: Samsung Display Co., LTD., Yongin-si (KR)

(72) Inventors: Yeoung Keol Woo, Seongnam-si (KR); Yung Bin Chung, Yongin-si (KR); Chul Min Bae, Hwaseong-si (KR); Ji Hye Han, Seoul (KR); Eun Jin Kwak, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 29 days.

(21) Appl. No.: 16/906,866

(22) Filed: Jun. 19, 2020

(65) Prior Publication Data

US 2021/0050536 A1 Feb. 18, 2021

(30) Foreign Application Priority Data

Aug. 12, 2019 (KR) ........................ 10-2019-0098303

(51) Int. Cl.
*H01L 51/00* (2006.01)
*H01L 27/32* (2006.01)
*H01L 51/56* (2006.01)

(52) U.S. Cl.
CPC ...... *H01L 51/0097* (2013.01); *H01L 27/3272* (2013.01); *H01L 51/003* (2013.01); *H01L 51/56* (2013.01); *H01L 2227/326* (2013.01); *H01L 2251/301* (2013.01); *H01L 2251/303* (2013.01); *H01L 2251/5338* (2013.01); *H01L 2251/558* (2013.01)

(58) Field of Classification Search
None
See application file for complete search history.

(56) References Cited

U.S. PATENT DOCUMENTS

| 9,685,640 | B2* | 6/2017 | Hayk | ................... H01L 51/003 |
| 2016/0111683 | A1* | 4/2016 | Kachatryan | ......... H01L 51/0097 |
| | | | | 257/40 |
| 2017/0104048 | A1* | 4/2017 | Chung | ................ H01L 27/3262 |
| 2019/0355800 | A1* | 11/2019 | Saitoh | ................. H01L 51/0097 |

FOREIGN PATENT DOCUMENTS

| CN | 104576971 | 4/2015 |
| KR | 101330456 B1 | 11/2013 |
| WO | 2015176487 | 11/2015 |

OTHER PUBLICATIONS

Kyoungmin Min et al., "Interfacial adhesion behavior of polyimides on silica glass: A molecular dynamics study," Polymer, 2016, pp. 1-10, vol. 98, Elsevier Ltd.
Extended European search report—European Application No. 20184362.0 dated Nov. 27, 2020, citing references listed within.

* cited by examiner

*Primary Examiner* — J. E. Schoenholtz
(74) *Attorney, Agent, or Firm* — Cantor Colburn LLP

(57) ABSTRACT

A method of manufacturing a display device includes providing an inorganic layer on a carrier substrate, providing a first flexible substrate on the inorganic layer, providing a first shielding layer including a metal on the first flexible substrate, providing a first barrier layer on the first shielding layer, and providing a thin film transistor layer on the first barrier layer. The inorganic layer includes at least one material selected from silicon nitride (SiNx), silicon oxide (SiOx), and silicon oxynitride (SiOxNy), and a thickness of the inorganic layer is in a range from about 10 Å to about 6000 Å.

19 Claims, 21 Drawing Sheets

120: GE, CE1
130: CE2
140: SE, DE, ELVDDE
150: DL, CNE, ELVDDL

120: GE, CE1
130: CE2
140: SE, DE, ELVDDE
150: DL, CNE, ELVDDL

120: GE, CE1
130: CE2
140: SE, DE, ELVDDE
150: DL, CNE, ELVDDL

FIG. 23

|  | STRUCTURE TO WHICH INVENTION IS NOT APPLIED | STRUCTURE TO WHICH INVENTION IS APPLIED |
|---|---|---|
| 1st Barrier | Adhesion (gf/inch) | Adhesion (gf/inch) |
| Skip | 10 | 4.6 |
| $SiO_x$ 6000 | 1087.9 | 7.3 |

DISPLAY DEVICE AND METHOD OF MANUFACTURING THE DISPLAY DEVICE

This application claims priority to Korean Patent Application No. 10-2019-0098303, filed on Aug. 12, 2019, and all the benefits accruing therefrom under 35 U.S.C. § 119, the content of which in its entirety is herein incorporated by reference.

BACKGROUND

1. Field

Embodiments of the invention relate to a display device and a method of manufacturing the display device.

2. Description of the Related Art

A display device is a device that visually displays image data. Such a display device typically includes a substrate divided into a display area and a non-display area. A pixel may be disposed on the substrate in the display area, and a pad or the like may be disposed on the substrate in the non-display area. On the pad, a driving circuit or the like may be mounted and transmit a driving signal to the pixel.

SUMMARY

A display device may include a flexible substrate and a plurality of laminated structures laminated sequentially on the flexible substrate. The structures of the display device may be formed on a carrier substrate. When the structures are deposited and the carrier substrate is delaminated from the flexible substrate, it may not be easy to delaminate the flexible substrate and the carrier substrate from each other.

An embodiment of the invention provides a display device in which it is easy to delaminate a flexible substrate and a carrier substrate from each other.

An embodiment of the invention provides a method of manufacturing a display device in which it is easy to delaminate a flexible substrate and a carrier substrate from each other.

According to an embodiment, a method of manufacturing a display device includes providing an inorganic layer on a carrier substrate, providing a first flexible substrate on the inorganic layer, providing a first shielding layer including a metal on the first flexible substrate, providing a first barrier layer on the first shielding layer, and providing a thin film transistor layer on the first barrier layer. In such an embodiment, the inorganic layer includes at least one material selected from silicon nitride (SiNx), silicon oxide (SiOx), and silicon oxynitride (SiOxNy), and a thickness of the inorganic layer is a range from 10 angstrom (Å) to 6000 Å.

In an embodiment, a thickness of the first shielding layer may be in a range from 10 Å to 6000 Å.

In an embodiment, the inorganic layer may prevent electrostatic attraction between the carrier substrate and the first flexible substrate from being generated.

In an embodiment, the providing the first barrier layer may include forming the first barrier layer using plasma enhanced chemical vapor deposition ("PECVD").

In an embodiment, the method may further include providing a second flexible substrate on a surface of the first barrier layer after the providing the first barrier layer and before the providing the thin film transistor layer on the first barrier layer.

In an embodiment, the method may further include providing a second shielding layer on a surface of the second flexible substrate before the providing the second flexible substrate and after the providing the thin film transistor layer.

In an embodiment, the method may further include providing a second barrier layer on a surface of the second shielding layer after the providing the second shielding layer on the surface of the second flexible substrate and before the providing the thin film transistor layer.

In an embodiment, a first coupling force between the inorganic layer and the carrier substrate may be greater than a second coupling force between the first flexible substrate and the inorganic layer.

In an embodiment, the method may further include delaminating the carrier substrate and the inorganic layer from the surface of the first flexible substrate after the providing the thin film transistor layer.

In an embodiment, the delaminating the carrier substrate and the inorganic layer from the surface of the first flexible substrate may include delaminating the carrier substrate and the inorganic layer from the surface of the first flexible substrate using a mechanical detaching method.

According to another embodiment, a method of manufacturing a display device includes providing a dipole-removing layer on a carrier substrate, providing a flexible substrate on the dipole-removing layer, providing a barrier layer on the flexible substrate, and providing a thin film transistor layer on the barrier layer. In such an embodiment, the dipole-removing layer includes an inorganic material, and a thickness of the dipole-removing layer is in a range from about 10 Å to about 6000 Å.

In an embodiment, the inorganic material may include at least one material selected from SiNx, SiOx, and SiOxNy.

In an embodiment, the method may further include delaminating the carrier substrate and the dipole-removing layer from one surface of the flexible substrate after the providing the thin film transistor layer.

In an embodiment, the delaminating the carrier substrate and the dipole-removing layer from the surface of the flexible substrate may include emitting ultraviolet lasers toward the surface of the flexible substrate and removing the carrier substrate and the dipole-removing layer from the surface of the flexible substrate using a mechanical detaching method.

According to another embodiment, a display device includes a first flexible substrate, a first barrier layer disposed on a surface of the first flexible substrate, a thin film transistor layer disposed on a surface of the first barrier layer, and a residue disposed on an opposing surface of the first flexible substrate. In such an embodiment, the residue includes an inorganic material.

In an embodiment, the display device may further include a first shielding layer disposed between the first flexible substrate and the first barrier layer.

In an embodiment, the first shielding layer may include a metal.

In an embodiment, the display device may further include a second flexible substrate disposed between the first barrier layer and the thin film transistor layer and a second barrier layer disposed between the second flexible substrate and the thin film transistor layer.

In an embodiment, the display device may further include a second shielding layer disposed between the second barrier layer and the second flexible substrate. In such an embodiment, the second shielding layer includes a metal.

In an embodiment, the inorganic material may include at least one material selected from SiNx, SiOx, and SiOxNy.

BRIEF DESCRIPTION OF THE DRAWINGS

The above and other features of the disclosure will become more apparent by describing in detail exemplary embodiments thereof with reference to the attached drawings, in which:

FIG. 23 is a table illustrating a coupling force between a flexible substrate and a carrier substrate according to another alternative embodiment.

DETAILED DESCRIPTION

Figure 1:
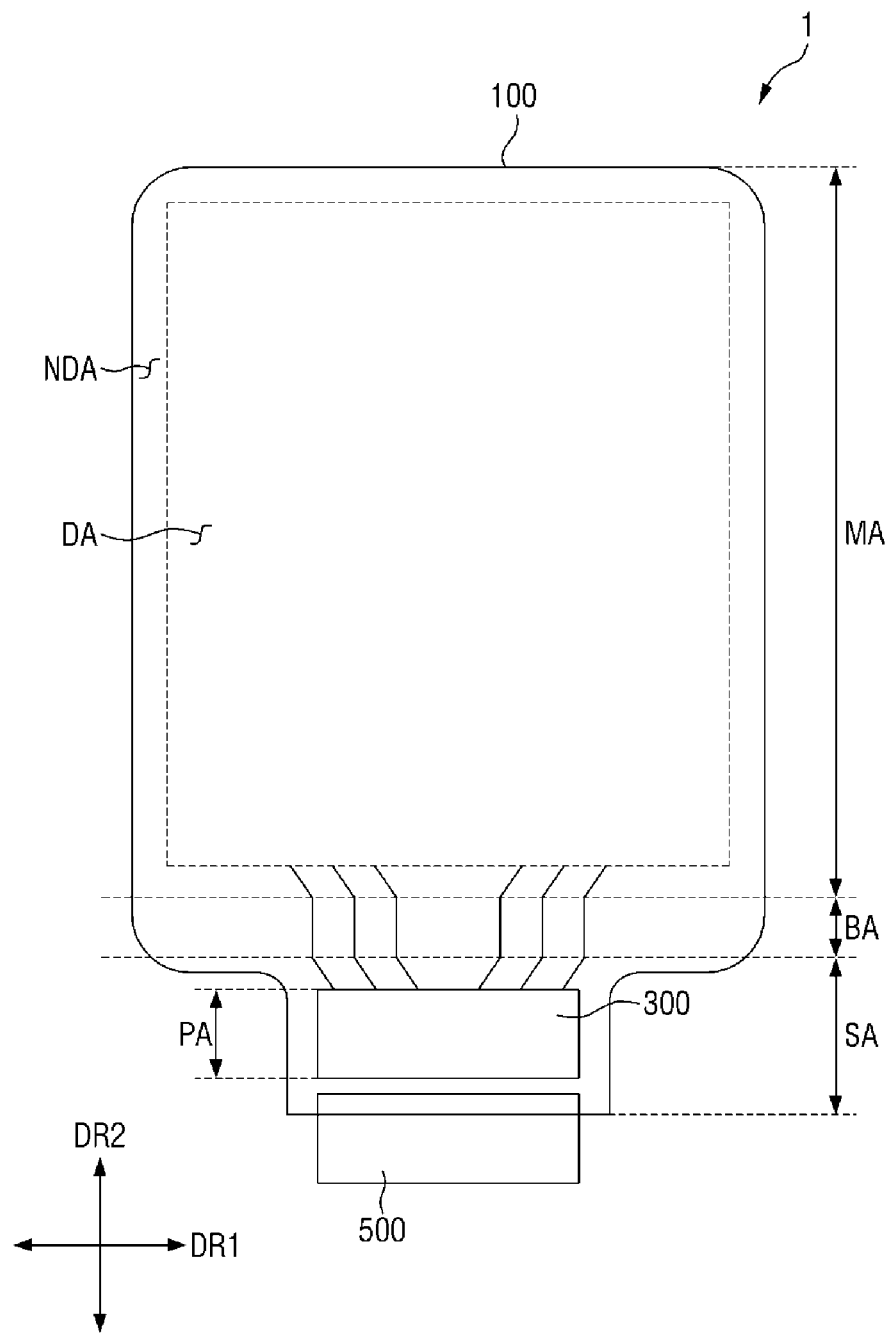
FIG. 1 is an arrangement plan view of a display device according to an embodiment.

The invention will now be described more fully hereinafter with reference to the accompanying drawings, in which various embodiments are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

A display device is a device which displays a moving picture or a still image and may be used for implementing a display screen of a variety of products such as not only portable electronic devices such as a mobile phone, a smart phone, a tablet personal computer (PC), a smart watch, a watch phone, a mobile communication terminal, an electronic notebook, an electronic book, a portable multimedia player (PMP), a navigation system, an ultra-mobile PC, and the like but also display devices such as a television, a laptop PC, a monitor, an advertising panel, an Internet of Things (IoT) device, and the like.

Hereinafter, embodiments of the disclosure will be described in detail with reference to the accompanying drawings.

Figure 2:
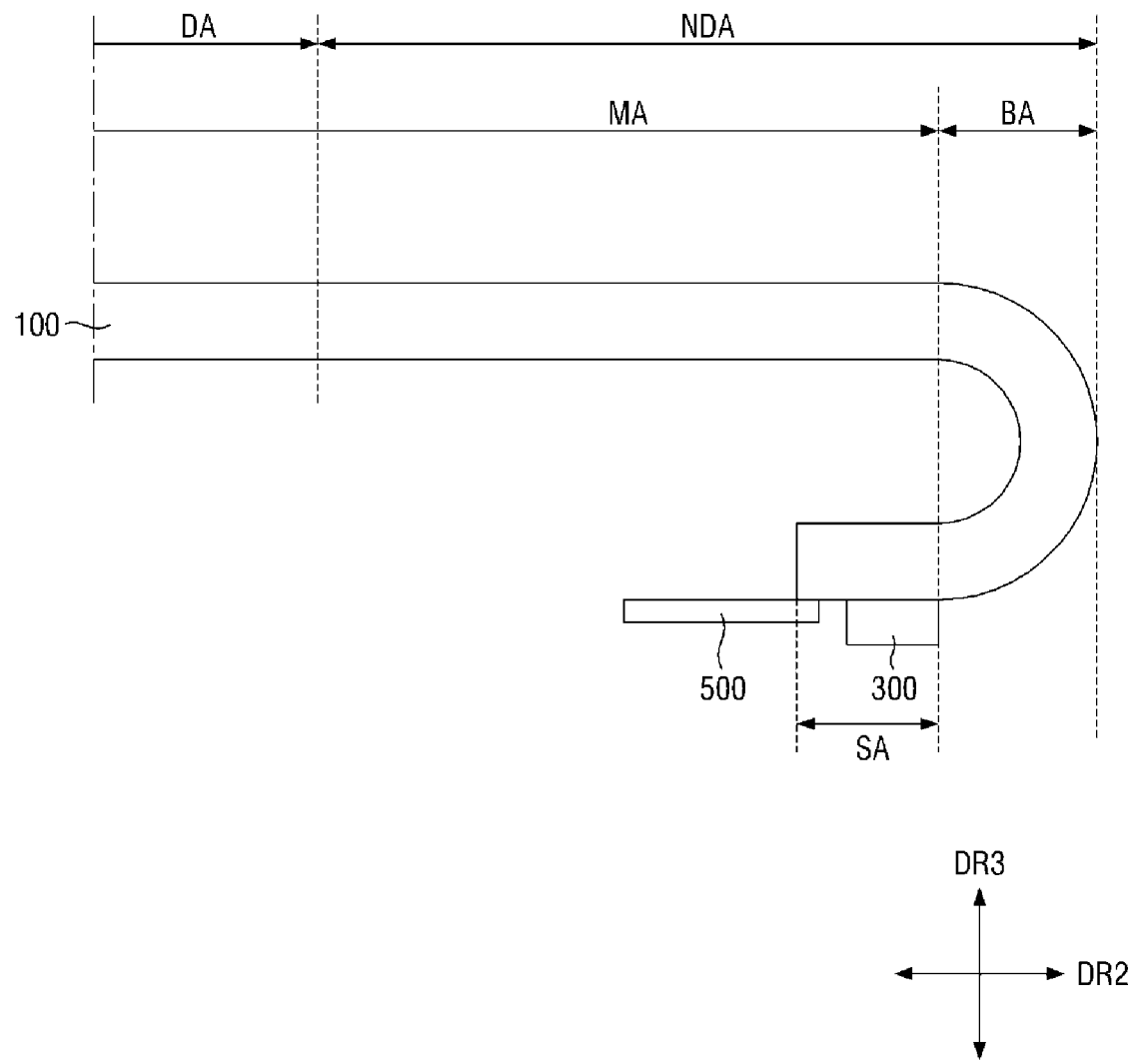
FIG. 2 is a schematic partial cross-sectional view of the display device in a bent state.

FIG. 1 is an arrangement plan view of a display device according to an embodiment, and FIG. 2 is a schematic partial cross-sectional view of the display device according to an embodiment.

Referring to FIGS. 1 and 2, an embodiment of a display device 1 includes a display area DA, which displays an image, and a non-display area NDA disposed on a periphery of the display area DA. The display area DA may have a rectangular shape with rectangular or rounded corners in a plan view in a third direction DR3 or a thickness direction of the display device 1. A planar shape of the display area DA is not limited to the rectangular shape and may be variously modified to be another shape such as a circular shape or an elliptical shape. The display area DA includes a plurality of pixels. A detailed cross-sectional structure of the pixel will be described below.

The non-display area NDA is disposed on the periphery of the display area DA. The non-display area NDA may be disposed to be adjacent to both sides in a first direction DR1 or both short sides of the display area DA. In an embodiment, as shown in FIG. 1, the non-display area NDA may be disposed to be adjacent to both sides in a second direction DR2 crossing the first direction DR1 or both long sides of the display area DA in addition to both short sides thereof and may surround all of the sides of the display area DA. In such an embodiment, the non-display area NDA may form or define edge portions of the display area DA.

The display device 1 may include a display panel 100, which displays a screen, and a driving integrated circuit 300 which is attached to the display panel 100 and drives a pixel circuit of the display panel 100. The driving integrated circuit 300 may be implemented as a chip on plastic ("COP") including a driving chip ("IC") and mounted directly on the display panel 100.

In one embodiment, for example, the display panel 100 is an organic light emitting display panel. Hereinafter, for convenience of description, embodiments where the display panel 100 is an organic light-emitting display panel will be described in detail, but the disclosure is not limited thereto and the display panel 100 may be another type of display panel such as a liquid crystal display ("LCD") panel, a field emission display ("FED") panel, an electrophoretic apparatus, or the like.

In an embodiment, as shown in FIGS. 1 and 2, the display panel 100 may include a main area MA and a bending area BA. The main area MA may be flat. In such an embodiment, the display area DA and a part of the non-display area NDA of the display panel 100 may be disposed in the main area MA.

The bending area BA may be disposed at least on one side of the main area MA. In an embodiment, as shown in FIGS. 1 and 2, a single bending area BA is disposed to be adjacent to a lower side of the main area MA, but not being limited thereto. Alternatively, bending areas BA may be disposed to be adjacent to other sides such as left, right, and upper sides of the main area MA. In an embodiment, the bending areas BA may be disposed on two or more sides of the main area MA.

The bending area BA may be bent in a direction opposite to a display direction (a bottom surface in the case of a top emissive type apparatus). In an embodiment, as described above, where at least a part of the non-display area NDA is bent in the direction opposite to the display direction, a bezel of the display device 1 may be reduced.

In an embodiment, the display device 1 may further include a sub area SA extending from the bending area BA. The sub area SA may be parallel to the main area MA. The sub area SA may overlap the main area MA in a thickness direction. The above-described bending area BA and sub area SA may be the non-display area NDA, but not being limited thereto.

The display panel 100 may include a pad area PA disposed in the non-display area NDA. The pad area PA may be located in the sub area SA as shown in FIG. 1. However, the pad area PA is not limited thereto, and alternatively, may be located in the main area MA or the bending area BA. The driving integrated circuit 300 may be attached to the pad area PA of the display panel 100.

A plurality of signal lines are arranged in the pad area PA of the non-display area NDA. The plurality of signal lines may be connected to a thin film transistor of the pixel in the display area DA through a connecting line electrically connected to the thin film transistor. The connecting line may be disposed on the display area DA and the non-display area NDA. Bumps of the driving integrated circuit 300 may be connected to the plurality of signal lines.

The display device 1 may include a printed circuit board 500 attached to the display panel 100. In an embodiment, the printed circuit board 500 may be attached to an outside of the pad area PA of the display panel 100 in the non-display area NDA. In such an embodiment, the pad area PA to which the driving integrated circuit 300 is attached may be disposed between the display area DA and an area to which the printed circuit board 500 is attached. The printed circuit board 500 may be attached to a bottom end of the sub area SA. The printed circuit board 500 may be a flexible printed circuit board ("FPCB"). However, the printed circuit board 500 is not limited thereto, and alternatively, may be connected to the display panel 100 through a flexible film.

Figure 3:
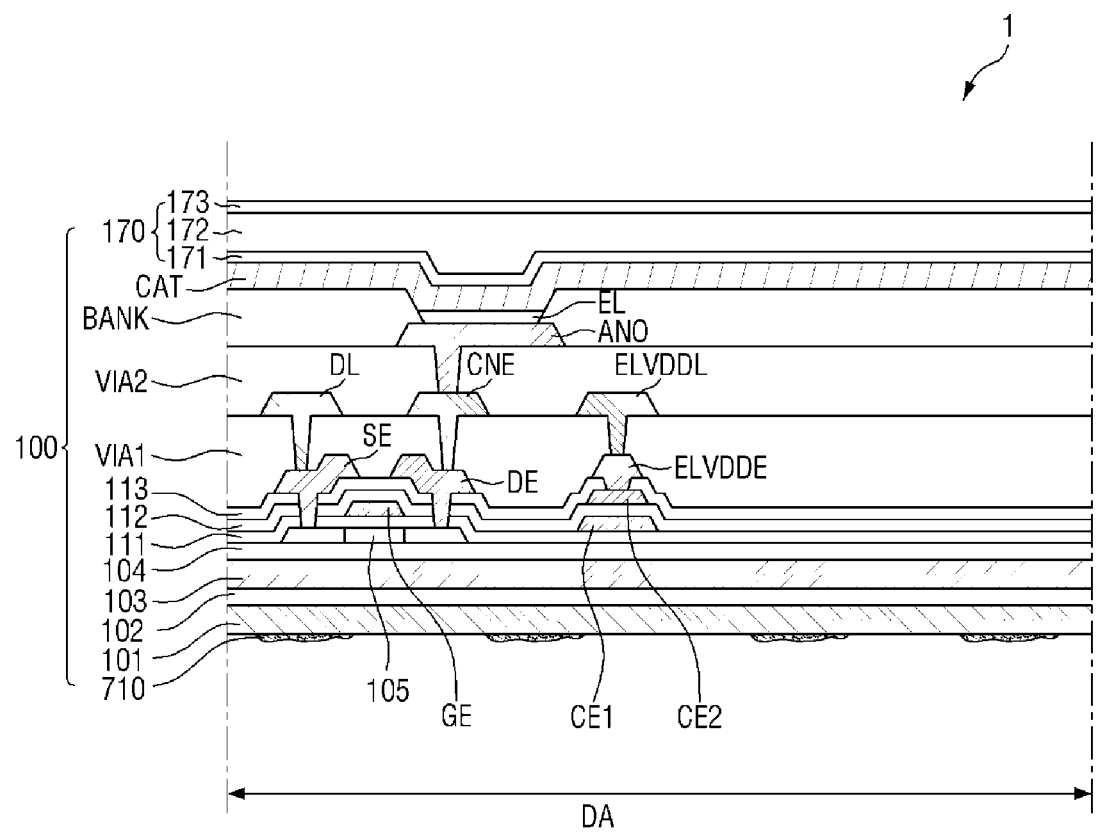
FIG. 3 is a cross-sectional view illustrating a pixel according to an embodiment.
Figure 3:
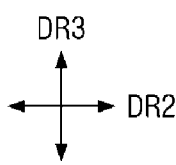

FIG. 3 is a cross-sectional view illustrating a pixel and the pad area according to an embodiment.

In an embodiment, the display device 1 may further include a panel bottom sheet (not shown) disposed below the display panel 100. The panel bottom sheet may be attached to a bottom surface of the display panel 100. The panel bottom sheet includes a functional layer. The functional layer may be a layer which performs a heat dissipation function, an electromagnetic wave blocking function, a grounding function, a buffering function, a reinforcing function, a supporting function or a digitizing function, for example. The functional layer may be a sheet layer including or formed of a sheet, a film layer including or formed of a film, a thin film layer, a coating layer, a panel, a plate, and the like. One functional layer may be a single layer, or may be formed of or defined by a plurality of laminated thin films or coating layers. The functional layer may be, for example, a support member, a heat dissipation layer, an electromagnetic wave blocking layer, a shock-absorbing layer or a digitizer, for example.

In an embodiment, as shown in FIG. 3, the display panel 100 may include a display substrate 101, a plurality of conductive layers, a plurality of insulating layers which insulate the conductive layers from each other, an organic layer EL, or the like.

The display substrate 101 or a first flexible substrate is disposed all over the display area DA and the non-display area NDA. The display substrate 101 may perform a function of supporting elements disposed thereabove. In an embodiment, the display substrate 101 may be a flexible substrate including a flexible material such as polyimide ("PI") or the like.

A barrier layer 102 or a first barrier layer may be disposed on the display substrate 101. The barrier layer 102 may be disposed on a surface or an upper surface of the display substrate 101. The barrier layer 102 may effectively prevent humidity and oxygen from penetrating from the outside through the display substrate 101. The barrier layer 102 may include at least one film selected from a silicon nitride (SiNx) film, a silicon oxide (SiO$_2$) film, and a silicon oxynitride (SiO$_x$N$_y$) film.

A second flexible substrate 103 may be disposed on the barrier layer 102. The second flexible substrate 103 may be disposed on a surface or an upper surface of the barrier layer 102. The second flexible substrate 103 may be disposed all over the display area DA and the non-display area NDA. The second flexible substrate 103 may include a same material as the display substrate 101 or the first flexible substrate.

A second barrier layer 104 may be disposed on the second flexible substrate 103. The second barrier layer 104 may be disposed on a surface or an upper surface of the second flexible substrate 103. The second barrier layer 104 may effectively prevent humidity and oxygen from penetrating from the outside through the display substrate 101 and the second flexible substrate 103. The second barrier layer 104 may include at least one film selected from an SiNx film, an SiO$_2$ film, and an SiO$_x$N$_y$ film.

A semiconductor layer 105 may be disposed on the second barrier layer 104. The semiconductor layer 105 may be disposed on a surface or an upper surface of the second barrier layer 104. The semiconductor layer 105 forms a channel of the thin film transistor. The semiconductor layer 105 may be disposed in each pixel of the display area DA and may be selectively disposed in the non-display area NA. The semiconductor layer 105 may include a source/drain area and an active area. The semiconductor layer 105 may include polycrystalline silicon.

A first insulating layer 111 may be disposed on the semiconductor layer 105. The first insulating layer 111 may be disposed on or over an entire surface of the display substrate 101. The first insulating layer 111 may be a gate insulating film having a gate insulating function. The first insulating layer 111 may include a silicon compound, metal oxide, or the like. In one embodiment, for example, the first insulating layer 111 may include at least one material selected from silicon oxide, silicon nitride, silicon oxynitride, aluminum (Al) oxide, tantalum (Ta) oxide, hafnium (Hf) oxide, zirconium (Zr) oxide, titanium (Ti) oxide, and a combination thereof.

A first conductive layer 120 may be disposed on the first insulating layer 111. The first conductive layer 120 may include a gate electrode GE of a thin film transistor, a first electrode CE1 of a storage capacitor, and a connecting line. The connecting line may extend through the display area DA and the pad area PA. The first conductive layer 120 may include at least one material selected from molybdenum (Mo), Al, platinum (Pt), palladium (Pd), silver (Ag), magnesium (Mg), gold (Au), nickel (Ni), neodymium (Nd), iridium (Ir), chrome (Cr), calcium (Ca), Ti, Ta, tungsten (W), and copper (Cu). The first conductive layer 120 may be a single film or a multi-layer film (e.g., a lamination film), in which each layer include or is formed of at least one material selected from the above-listed material.

A second insulating layer 112 may be disposed on the first conductive layer 120. The second insulating layer 112 may insulate the first conductive layer 120 and a second conductive layer 130 from each other. The second insulating layer 112 may be disposed generally in the display area DA. Although not shown in the drawings, the second insulating layer 112 may expose a top surface of the connecting line in the pad area PA. The second insulating layer 112 may include at least one material selected from the above-listed materials of the first insulating layer 111.

The second conductive layer 130 may be disposed on the second insulating layer 112. The second conductive layer 130 may include a second electrode CE2 of the storage capacitor. A material of the second conductive layer 230 may be selected from the above-listed materials of the first conductive layer 120. The first electrode CE1 of the storage capacitor and a second electrode CE2 of the storage capacitor may collectively define a capacitor with the second insulating layer 112.

A third insulating layer 113 may be disposed on the second conductive layer 130. The third insulating layer 113 may include at least one material selected from the above-listed materials of the first insulating layer 111. In some embodiments, the third insulating layer 113 may include an organic insulating material. The organic insulating material may include at least one material selected from the above-listed materials of a first via layer VIA1 which will be described below.

A third conductive layer 140 may be disposed above the third insulating layer 113, the second insulating layer 112, and the connecting line. The third conductive layer 140 may include a source electrode SE, a drain electrode, DE, and a high-potential voltage electrode ELVDDE. The third conductive layer 140 may include at least one material selected from Mo, Al, Pt, Pd, Ag, Mg, Au, Ni, Nd, Ir, Cr, Ca, Ti, Ta, W, and Cu. The third conductive layer 140 may be a single film including or formed of at least one material selected from the above-listed material. The third conductive layer 140 is not limited thereto, and may be a lamination film. In an embodiment, the third conductive layer 140 may have a lamination structure such as Ti/Al/Ti, Mo/Al/Mo, Mo/AlGe/Mo, Ti/Cu, or the like. In an embodiment, for example, the third conductive layer 140 may include a structure of Ti/Al/Ti.

Although not shown in the drawings, the third conductive layer 140 may further include a signal line disposed in the pad area PA. The signal line may be disposed to overlap the connecting line of the first conductive layer 120 in a thickness direction of the display substrate 101 or the third direction DR3 and may be electrically connected to the connecting line through an exposed part of the second insulating layer 112 in the pad area PA. A planar size of the signal line may be greater than a planar size of the connecting line. Herein, the term "planar size" may mean a size when shown in a plan view in the third direction DR3.

The semiconductor layer 105, the gate electrode GE of the thin film transistor of the first conductive layer 120, and the source/drain electrodes SE/DE of the third conductive layer

140 may define a triple terminal of the thin film transistor. Hereinafter, the semiconductor layer 105, the gate electrode GE of the thin film transistor of the first conductive layer 120, and the source/drain electrodes SE/DE of the third conductive layer 140 may be referred to as a thin film transistor layer LTPS (refer to FIG. 6).

The first via layer VIA1 may be disposed on the third conductive layer 140. The first via layer VIA1 may include an organic insulating material. The organic insulating layer may include at least one material selected from an acrylic resin, an epoxy resin, a phenolic resin, a polyamide resin, a polyimide resin, an unsaturated polyester resin, a poly phenylenether resin, a polyphenylenesulfide resin, and benzocyclobutene ("BCB").

A fourth conductive layer 150 may be disposed on the first via layer VIAL The fourth conductive layer 150 may include a data line DL, a connecting electrode CNE, and a high-potential voltage line ELVDDL. The data line DL may be electrically connected to the source electrode SE of the thin film transistor through a via hole defined through the first via layer VIAL The connecting electrode CNE may be electrically connected to the drain electrode DE of the thin film transistor through a contact hole defined through the first via layer VIAL. The high-potential voltage line ELVDDL may be electrically connected to the high-potential voltage electrode ELVDDE through a contact hole defined through the first via layer VIAL. The fourth conductive layer 150 may include at least one material selected from the above-listed materials of the third conductive layer 140.

A second via layer VIA2 may be disposed on the fourth conductive layer 150. The second via layer VIA2 may include at least one material selected from the above-listed materials of the first via layer VIA'.

An anode electrode ANO is disposed on the second via layer VIA2. The anode electrode ANO may be electrically connected to the connecting electrode CNE through a contact hole defined through the second via layer VIA2.

A bank layer BANK may be disposed on the anode electrode ANO. A contact hole, which exposes the anode electrode ANO, is defined through the bank layer BANK. The bank layer BANK may include an organic insulating material or inorganic insulating material. In one embodiment, for example, the bank layer BANK may include at least one material selected from a photoresist, a polyimide resin, an acrylic resin, a silicone compound and a polyacrylic resin, for example.

The organic layer EL may be disposed on a top surface of the anode electrode ANO and in an opening portion of the bank layer BANK. A cathode electrode CAT is disposed on the organic layer EL and the bank layer BANK. The cathode electrode CAT may be a common electrode disposed over the plurality of pixels.

A thin film encapsulation layer 170 is disposed on the cathode electrode CAT. The thin film encapsulation layer 170 may cover an organic light-emitting diode ("OLED"). The thin film encapsulation layer 170 may be a lamination film formed by alternately laminating an inorganic film and an organic film. In one embodiment, for example, the thin film encapsulation layer 170 may include a first inorganic encapsulation film 171, an organic encapsulation film 172, and a second inorganic encapsulation film 173 which are sequentially laminated.

In an embodiment of the display device 1, a residue 710 may be further disposed on an opposing surface (e.g., a lower surface) of the display substrate 101 opposite to the surface thereof. The residue 710 may include at least one film selected from an SiNx film, an SiO2 film, and an SiOxNy film.

The residue 710 may include a same material as that of a dipole-removing layer 710a (refer to FIG. 6) disposed between a carrier substrate 600 (refer to FIG. 6) and the display substrate 101 to easily detach or delaminate the carrier substrate 600 from the display substrate 101 in a method of manufacturing the display device according to an embodiment, which will be described below. The residue 710 may be a film or layer that is a residual part of the dipole-removing layer 710a when the dipole-removing layer 710a and the carrier substrate 600 are detached or delaminated from the opposing surface of the display substrate 101.

Figure 4:
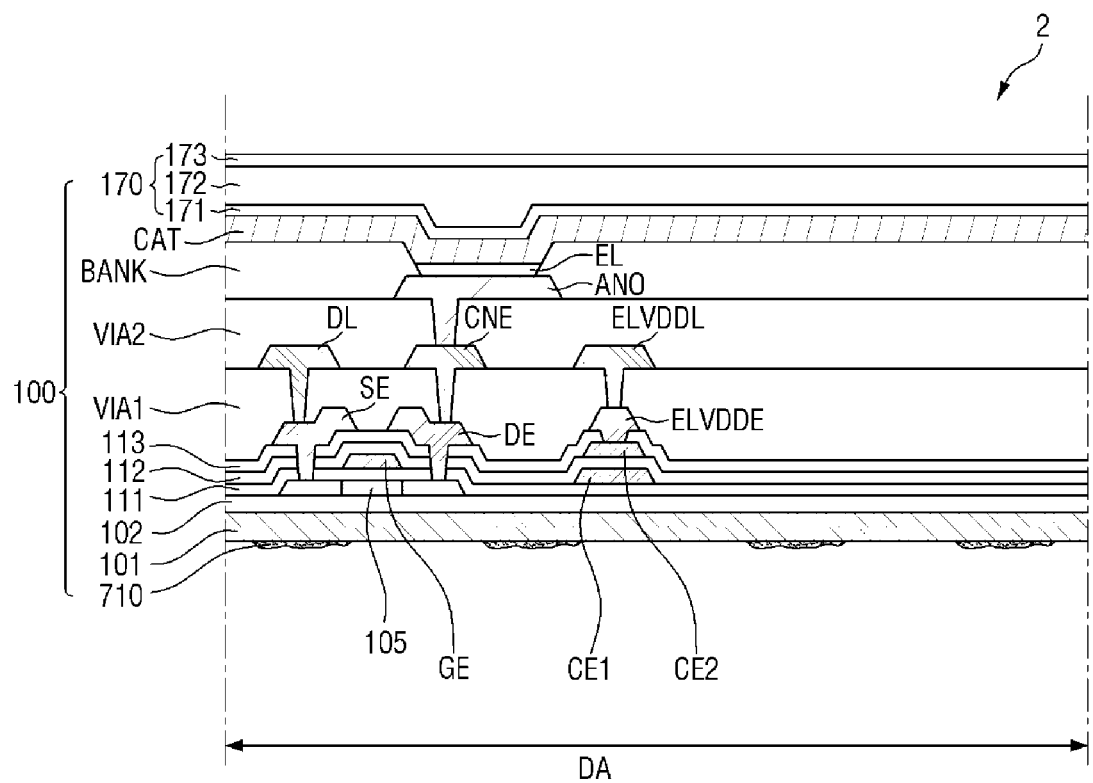
FIG. 4 is a cross-sectional view illustrating a pixel according to an alternative embodiment.

FIG. 4 is a cross-sectional view illustrating a pixel according to an alternative embodiment.

The pixel of a display device 2 shown in FIG. 4 is substantially the same as the pixel of the display device 1 of FIG. 3 except that the second flexible substrate 103 and the second barrier layer 104 described above with reference to FIG. 3 are omitted. In such an embodiment, the semiconductor layer 105 may be disposed on a surface of the barrier layer 102.

Hereinafter, an embodiment of a method of manufacturing the above-described display device will be described. In such an embodiment, components substantially the same or like as those of the embodiments described above will be referred to with the same or like reference numerals, and any repetitive description thereof will hereinafter be omitted or simplified.

Figure 5:
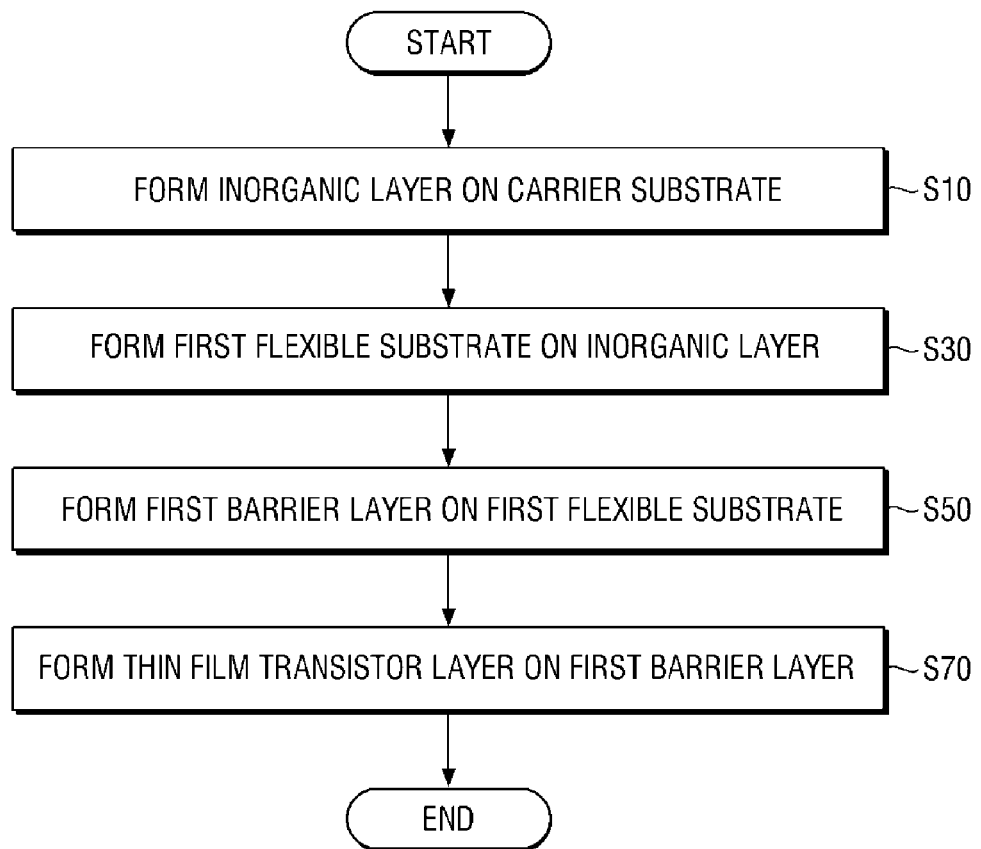
FIG. 5 is a flowchart illustrating a method of manufacturing the display device according to an embodiment.
Figure 6:
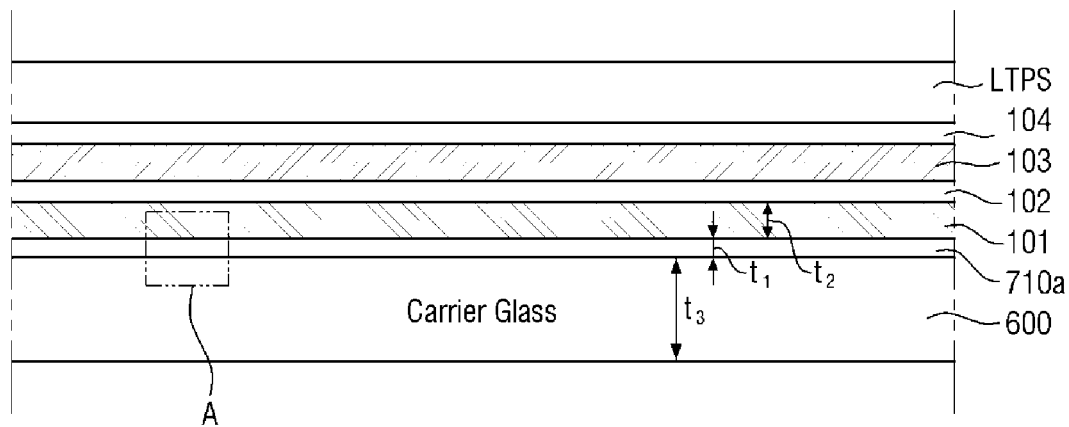
FIGS. 6 and 10 are cross-sectional views of processing operations of the method of manufacturing the display device according to an embodiment.
Figure 7:
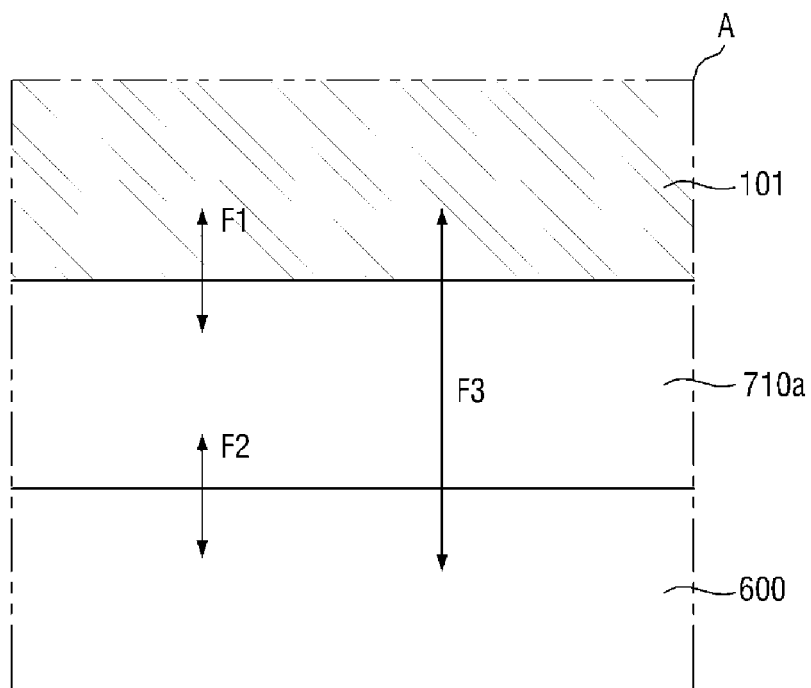
FIG. 7 is an enlarged cross-sectional view illustrating area A of FIG. 6.
Figure 8:
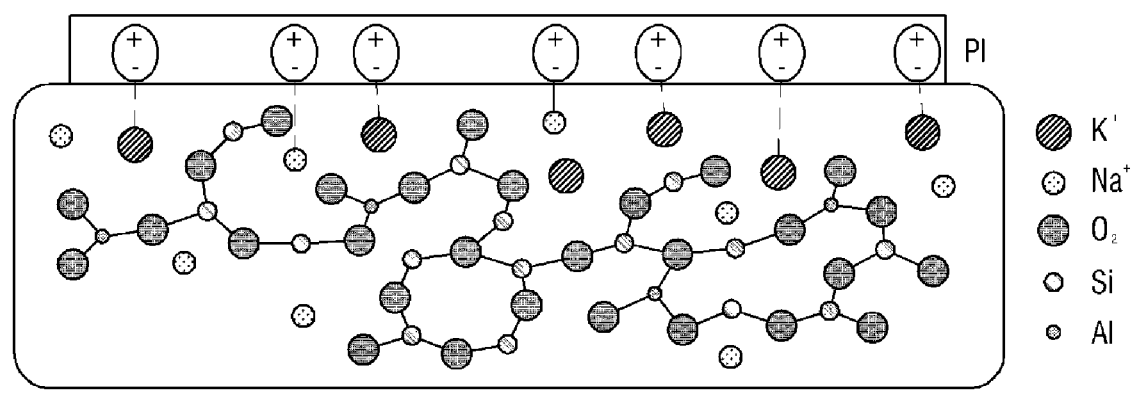
FIG. 8 is a cross-sectional view illustrating electrostatic attraction between a carrier substrate and a flexible substrate.
Figure 9:
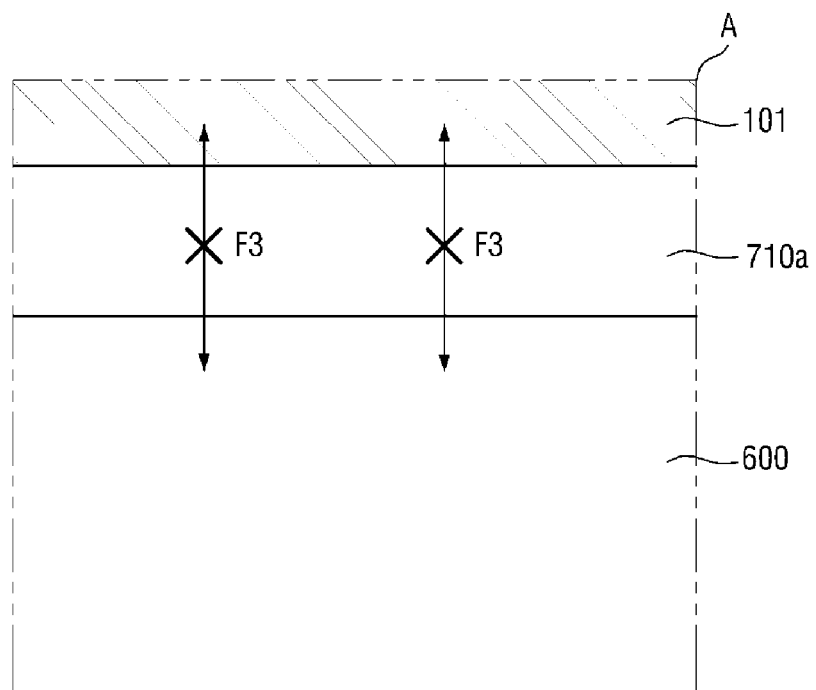
FIG. 9 is a cross-sectional view illustrating a case in which a dipole-removing layer blocks the electrostatic attraction between the flexible substrate and the carrier substrate.
Figure 10:
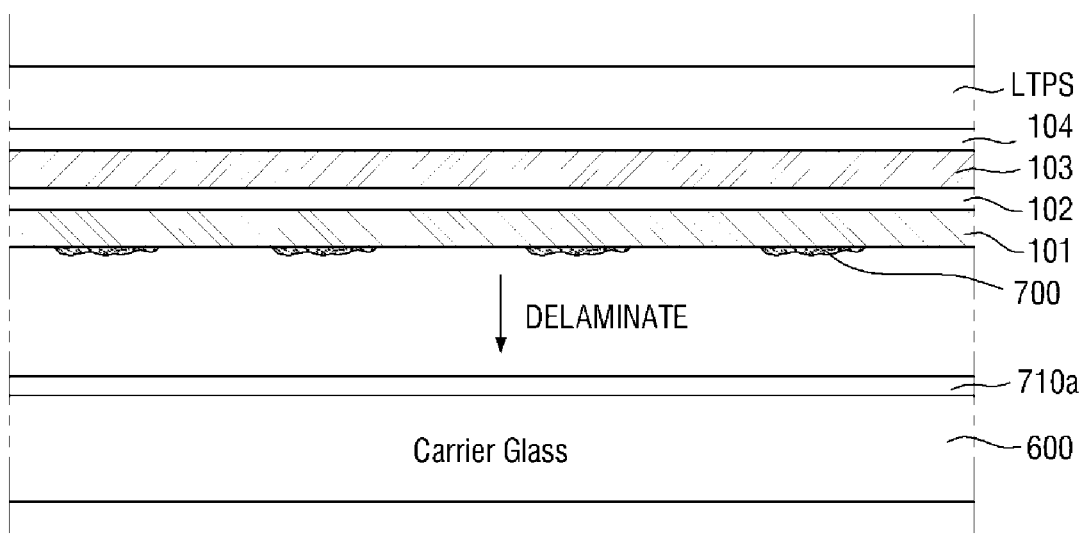

FIG. 5 is a flowchart illustrating a method of manufacturing a display device according to an embodiment, and FIGS. 6 and 10 are cross-sectional views of processing operations of the method of manufacturing the display device according to an embodiment. FIG. 7 is an enlarged cross-sectional view illustrating area A of FIG. 6, FIG. 8 is a cross-sectional view illustrating electrostatic attraction between a carrier substrate and a flexible substrate, and FIG. 9 is a cross-sectional view illustrating a case in which the dipole-removing layer blocks the electrostatic attraction between the flexible substrate and the carrier substrate.

First, referring to FIGS. 5 and 6, an embodiment of a method of manufacturing a display device may include providing or forming an inorganic layer on a carrier substrate (S10), providing or forming a first flexible substrate on the inorganic layer (S30), providing or forming a first barrier layer on the first shielding layer (S50), and providing or forming a thin film transistor on the first barrier layer (S70). Such an embodiment of a method of manufacturing a display device may further include providing or forming a first shielding layer including a metal on the first flexible substrate.

The carrier substrate 600 may perform a function of supporting the display substrate 101 or the first flexible substrate, the first barrier layer 102, the second flexible substrate 103, the second barrier layer 104 and the thin film transistor layer LTPS from below when deposited thereon. The carrier substrate 600 may include a rigid material. In one embodiment, for example, the carrier substrate 600 may include SiO2 as shown in FIG. 8. In an embodiment, the carrier substrate 600 may further include a small amount of impurities in addition to SiO2. The impurities may include Al, potassium (K), or sodium (Na). In an embodiment, K and Na may be included as positive ions in the carrier substrate 600. The impurities of the carrier substrate 600 may cause electrostatic attraction with the first flexible substrate 101, which will be described below in greater detail.

In an embodiment, an inorganic layer 710a is provided or formed on the carrier substrate 600.

The inorganic layer 710a may perform a function of increasing ease in a process of delaminating the carrier substrate 600 from the first flexible substrate 101 by reducing electrostatic attraction, and in detail, dipole moments between the carrier substrate 600 and the first flexible substrate 101 as follows. The inorganic layer 710a may include at least one film selected from an SiNx film, an SiO2 film, and an SiOxNy film.

In an embodiment, the operation S10 of providing or forming the inorganic layer 710a on the carrier substrate 600 may include forming a component of the inorganic layer 710a on a surface of the carrier substrate 600 using a chemical vapor deposition ("CVD").

In such an embodiment, the inorganic layer 710a is formed using CVD, such that the inorganic layer 710a may be a pure inorganic layer without impurities.

In such an embodiment, the first flexible substrate 101 is provided or formed on the inorganic layer 710a (S30).

Since the constituent materials and the function of the first flexible substrate 101 are substantially the same as those described above with reference to FIG. 3, any repetitive detailed description thereof will be omitted.

A first thickness t1 of the inorganic layer 710a may be in a range from about 10 angstrom (Å) to about 6000 Å. When the first thickness t1 of the inorganic layer 710a is greater than or equal to about 10 Å, electrostatic attraction between the first flexible substrate 101 and the carrier substrate 600 may be effectively reduced. When the first thickness t1 of the inorganic layer 710a is smaller than or equal to about 6000 Å, the first flexible substrate 101 which is formed after the inorganic layer 710a may be effectively prevented from becoming wrinkled or being formed with a surficial step due to the inorganic layer 710a formed using CVD.

In one embodiment, for example, a second thickness t2 of the first flexible substrate 101 may be in a range from about 5 micrometers (μm) to about 30 μm. The second thickness t2 of the first flexible substrate 101 may be smaller than the first thickness t1 of the inorganic layer 710a.

A third thickness t3 of the carrier substrate 600 may be in a range of about 3 millimeters (mm) to about 10 mm. The third thickness t3 of the carrier substrate 600 may be greater than the second thickness t2 of the first flexible substrate 101 and the first thickness t1 of the inorganic layer 710a.

Referring to FIG. 7, the inorganic layer 710a and the first flexible substrate 101 may be physically coupled with each other by a first coupling force F1, the inorganic layer 710a and the carrier substrate 600 may be physically coupled with each other by a second coupling force F2, and the first flexible substrate 101 and the carrier substrate 600 may be physically coupled with each other by a third coupling force F3.

The first coupling force F1 may be smaller than the second coupling force F2. The third coupling force F3 may be electrostatic attraction. In such an embodiment, the third coupling force F3 may be formed by a dipole moment between components of the first flexible substrate 101 and the carrier substrate 600 among the electrostatic attraction.

In such an embodiment, a first barrier layer 102 is provided or formed on the first flexible substrate 101 (S50).

Since the component and the function of the first barrier layer 102 are substantially the same as those described above with reference to FIG. 3, any repetitive detailed description thereof will be omitted.

In an embodiment, the operation S50 of providing or forming the first barrier layer 102 may be an operation of forming a component of the first barrier layer 102 on a surface of the first flexible substrate 101 using plasma enhanced chemical vapor deposition ("PECVD").

When the first barrier layer 102 is formed on the surface of the first flexible substrate 101, the third coupling force F3 between the first flexible substrate 101 and the carrier substrate 600 may increase, which will be below in greater detail.

In an embodiment, the second flexible substrate 103 is provided or formed on the first barrier layer 102. Since the component and the function of the second flexible substrate 103 are substantially the same as those described above with reference to FIG. 3, any repetitive detailed description thereof will be omitted.

In an embodiment, the second barrier layer 104 is provided or formed on the second flexible substrate 103. Since the component and the function of the second barrier layer 104 are substantially the same as those described above with reference to FIG. 3, any repetitive detailed description thereof will be omitted.

In an embodiment, the thin film transistor layer LTPS is formed on the second barrier layer 104 (70).

In an alternative embodiment, as described with reference to FIG. 4, the second flexible substrate 103 and the second barrier layer 104 may be omitted. In such an embodiment, the first barrier layer 102 is formed (S50) and then the thin film transistor layer LTPS is formed on the first barrier layer 102.

Since the thin film transistor layer LTPS are substantially the same as those described with reference to FIG. 3, any repetitive detailed description thereof will be omitted.

Referring to FIG. 8, as described above, the carrier substrate 600 may further include a small amount of impurities in addition to SiO2. The impurities may include Al, K, or Na. In an embodiment, K and Na may be included as positive ions in the carrier substrate 600. The impurities of the carrier substrate 600 may cause electrostatic attraction with the first flexible substrate 101. In such an embodiment, electrostatic attraction may occur between the impurities, and particularly, positive ions of the carrier substrate 600 and a component of the first flexible substrate 101. A total sum of the electrostatic attractions may be the above-described coupling force F3. When some of the impurities of the carrier substrate 600 have positive ions, some components of the first flexible substrate 101 take negative ions such that a dipole moment may occur therebetween.

Electrostatic attraction, that is, a dipole moment between some of the impurities of the carrier substrate 600, which take positive ions, and some components of the first flexible substrate 101, which take negative ions, may increase the third coupling force F3 between the carrier substrate 600 and the first flexible substrate 101 and may make delaminating of the carrier substrate 600 difficult in a process of delaminating the carrier substrate 600 from the first flexible substrate 101.

In an embodiment of the method of manufacturing the display device, as shown in FIG. 9, the inorganic layer 710a without impurities may be provided or formed between the carrier substrate 600 and the first flexible substrate 101 to prevent the electrostatic attraction, that is, the dipole moment, from occurring between some of the impurities of the carrier substrate 600, which take positive ions, and some of components of the first flexible substrate 101, which take negative ions. In such an embodiment, the third coupling force F3 may be blocked in advance. Accordingly, the carrier substrate 600 may be easily detached or delaminated from the first flexible substrate 101 in an operation of delaminating the carrier substrate 600 which will be described below.

In an embodiment, the carrier substrate 600 is detached or delaminated from the opposing surface of the first flexible substrate 101.

The operation of delaminating the carrier substrate 600 from the other surface of the first flexible substrate 101 may further include delaminating the inorganic layer 710a formed between the first flexible substrate 101 and the carrier substrate 600 with the carrier substrate 600. In such an embodiment, the coupling force between the inorganic layer 710a and the carrier substrate 600 is greater than the coupling force between the inorganic layer 710a and the first flexible substrate 101 as described above.

The operation of delaminating the carrier substrate 600 from the opposing surface of the first flexible substrate 101 may include diminishing the coupling force between the first flexible substrate 101 and the inorganic layer 710a by emitting lasers toward the opposing surface of the first flexible substrate 101 and mechanically detaching the inorganic layer 710a and the carrier substrate 600 from the opposing surface of the first flexible substrate 101.

In an embodiment, in a state in which the third coupling force F3 between the first flexible substrate 101 and the carrier substrate 600 is adequately diminished, it is possible to simply perform mechanical detachment when the carrier substrate 600 is delaminated from the opposing surface of the first flexible substrate 101.

Figure 11:
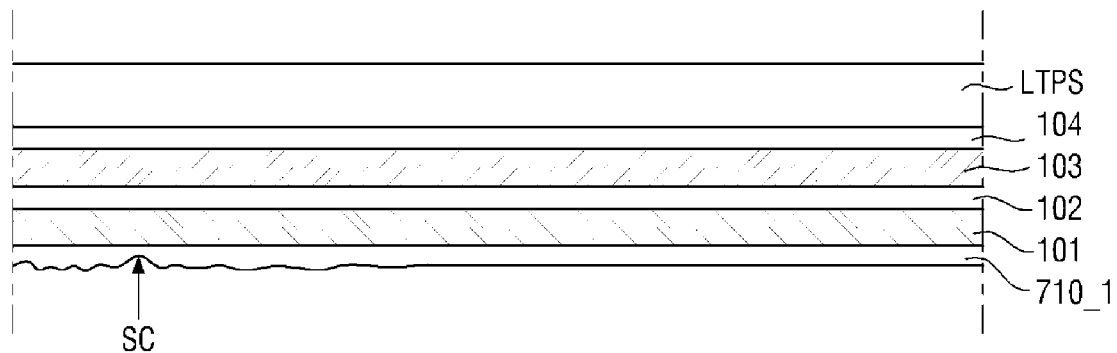
FIG. 11 is a cross-sectional view illustrating a processing operation of the method of manufacturing a display device according to an alternative embodiment.

FIG. 11 is a cross-sectional view illustrating a processing operation of a method of manufacturing a display device according to an alternative embodiment.

Referring to FIG. 11, such an embodiment of a method of manufacturing a display device is substantially the same as an embodiment of the method of manufacturing the display device described above with reference to FIGS. 5 to 9 except that a dipole-removing layer including an organic material is formed between the carrier substrate 600 and the first flexible substrate 101.

In such an embodiment, the dipole-removing layer may be provided or formed on the carrier substrate 600, and the first flexible substrate 101 may be provided or formed on the dipole-removing layer.

The dipole-removing layer may include an organic material and may be a pure organic layer without impurities like the inorganic layer 710a.

Since the dipole-removing layer includes the organic material, a coupling force with the carrier substrate 600 may be greater than a coupling force with the first flexible substrate 101 thereabove. Accordingly, as shown in FIG. 11, although a part of the dipole-removing layer is also separated from the opposing surface of the first flexible substrate 101 when the carrier substrate 600 is delaminated therefrom, a large amount of the dipole-removing layer may remain on the opposing surface of the first flexible substrate 101. An organic residue 710_1 which remains on the opposing surface of the first flexible substrate 101 may include uneven parts and scratches SC on a surface thereof.

Figure 12:
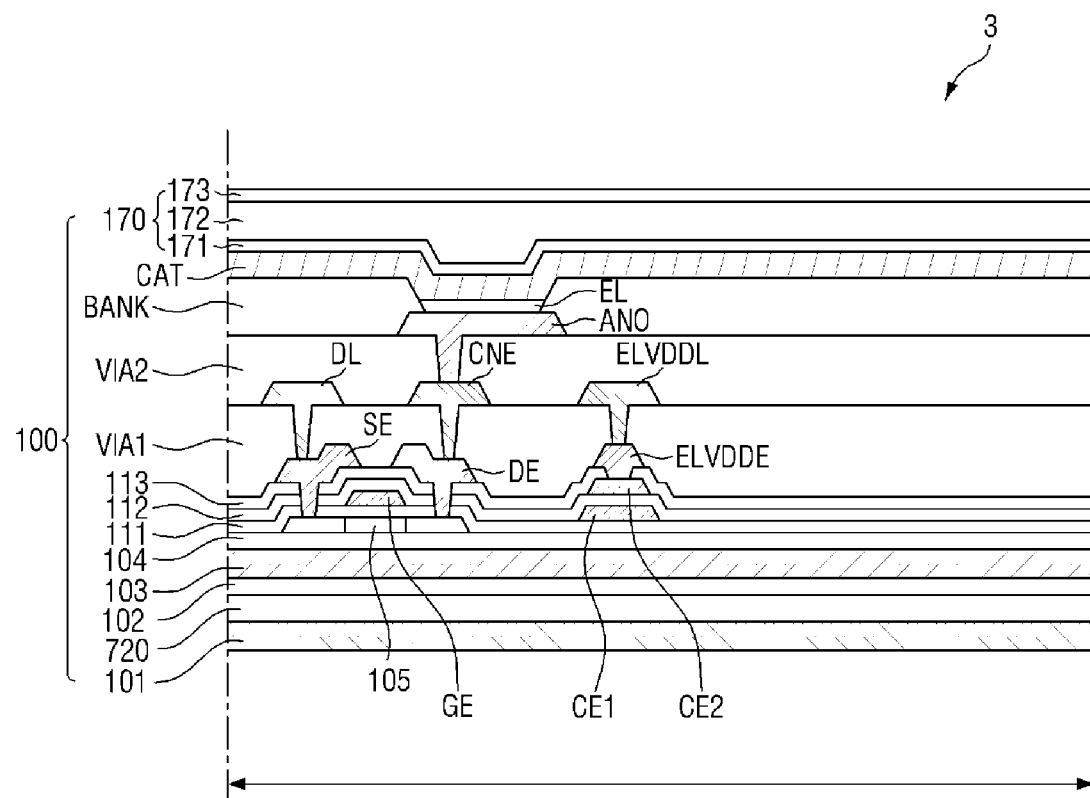
FIG. 12 is a cross-sectional view illustrating a pixel according to another alternative embodiment.

FIG. 12 is a cross-sectional view illustrating a pixel according to another alternative embodiment.

Referring to FIG. 12, such an embodiment of a display device 3 is substantially the same as an embodiment of the display device 1 described above with reference to FIGS. 1 to 3 except that the residue 710 is omitted from the display device 1 and a shielding layer 720 is further disposed between the first flexible substrate 101 and the first barrier layer 102.

In an embodiment of the display device 3, the shielding layer 720 may be further disposed between the first flexible substrate 101 and the first barrier layer 102.

The shielding layer 720 may include a metal. The metal may include, for example, at least one selected from Mo, Al, Pt, Pd, Ag, Mg, Au, Ni, Nd, Ir, Cr, Ca, Ti, Ta, W, and Cu. The shielding layer 720 may be a single film or a plurality of laminated films of the metal.

The shielding layer 720 may perform a function of reducing electrostatic attraction between the first flexible substrate 101 and the carrier substrate 600. In such an embodiment, as described below, in the shielding layer 720, an electrostatic potential energy difference between an upper part and a lower part of the first flexible substrate 101 is generated by plasma in the operation of forming the first barrier layer 102. The electrostatic potential energy difference may cause electrostatic attraction between the first flexible substrate 101 and the carrier substrate 600 to increase. in an embodiment of the display device 3, the electrostatic potential energy difference between the upper part and the lower part of the first flexible substrate 101 may be effectively prevented from being generated by plasma in advance by the first barrier layer 102 to prevent an increase in the electrostatic attraction between the first flexible substrate 101 and the carrier substrate 600 in advance.

A fourth thickness t4 of the shielding layer 720 may be in a range from about 10 Å to about 6000 Å. When the fourth thickness t4 of the shielding layer 720 is greater than or equal to about 10 Å, the electrostatic attraction between the first flexible substrate 101 and the carrier substrate 600 may be effectively reduced. When the fourth thickness t4 of the shielding layer 720 is smaller than or equal to about 6000 Å, it is possible to prevent poor performance of equipment used in the following process due to the shielding layer 720.

In an embodiment, the shielding layer 720 may include a metallic oxide. The metallic oxide may be, for example, indium tin oxide ("ITO"), indium zinc oxide ("IZO"), zinc oxide ("ZnO"), indium-tin-zinc-oxide ("ITZO"), magnesium oxide (MgO) or the like, but not being limited thereto.

Figure 13:
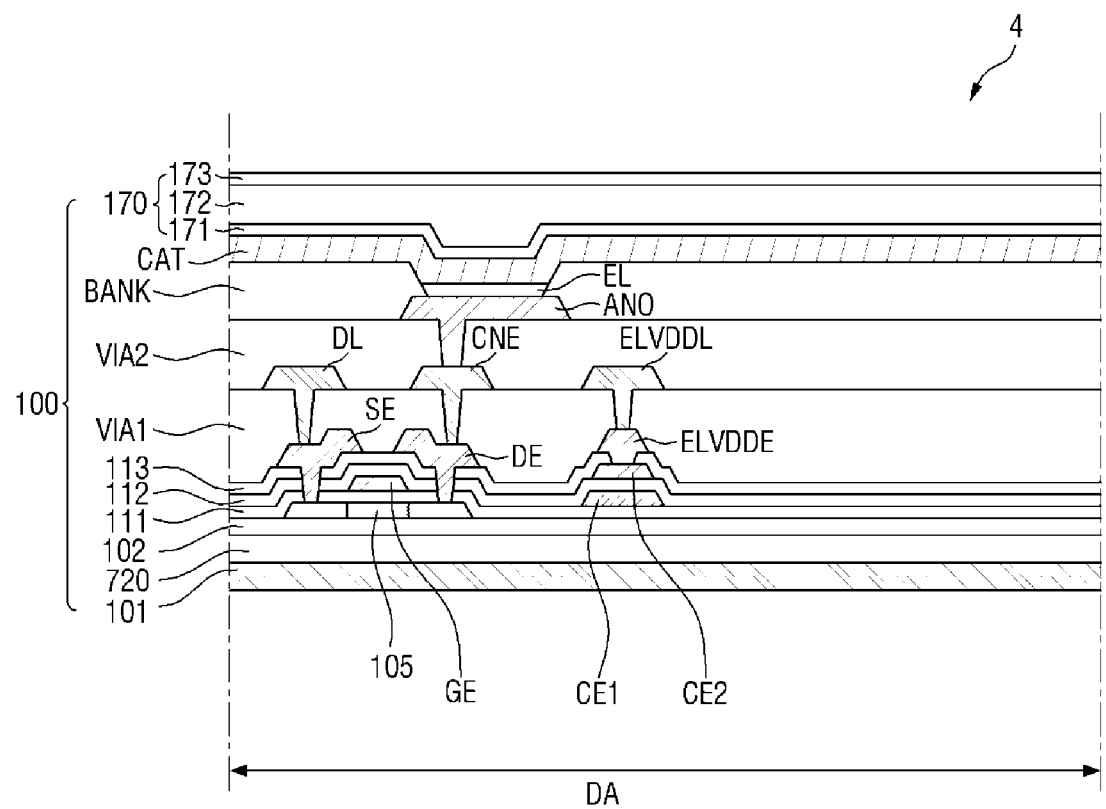
FIG. 13 is a cross-sectional view illustrating a pixel according to another alternative embodiment.

FIG. 13 is a cross-sectional view illustrating a pixel according to another alternative embodiment.

Referring to FIG. 13, such an embodiment of a display device 4 is substantially the same as an embodiment of the display device 3 described above with reference to FIG. 12 except that the second flexible substrate 103 and the second barrier layer 104 are omitted.

In such an embodiment of the display device 4, the second flexible substrate 103 and the second barrier layer 104 may be omitted.

Since other features are substantially the same as those described above with reference to FIGS. 12 and 3, any repetitive detailed description thereof will be omitted.

Figure 14:
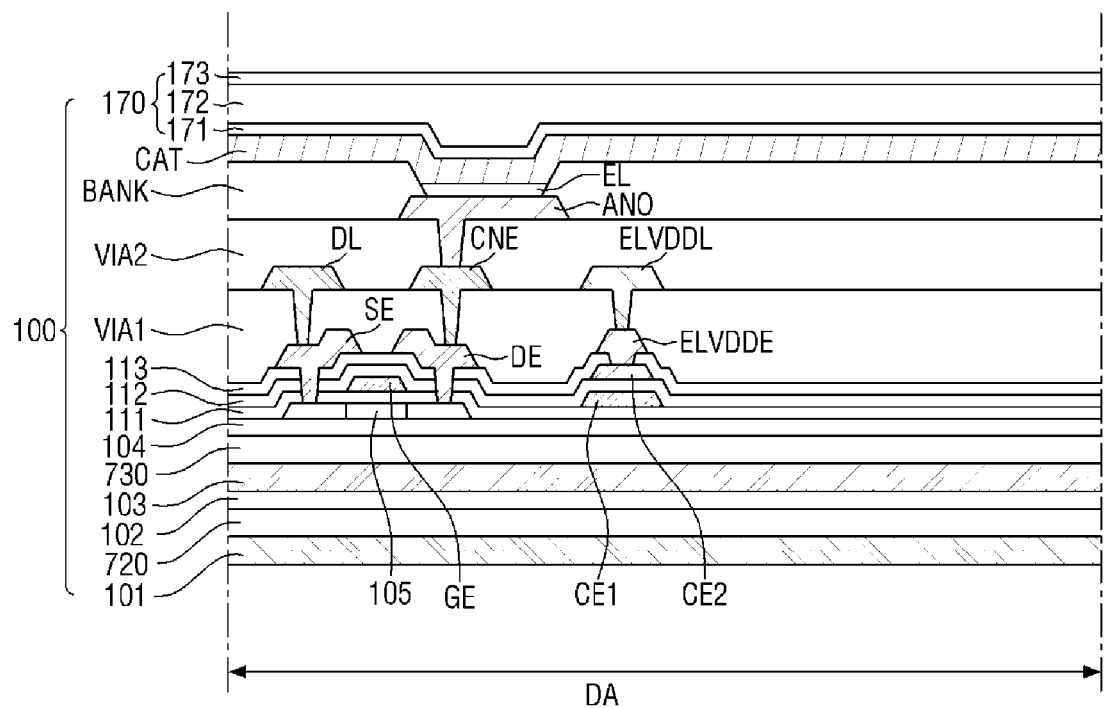
FIG. 14 is a cross-sectional view illustrating a pixel according to another alternative embodiment.
Figure 14:
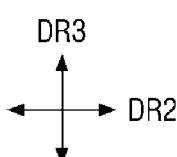

FIG. 14 is a cross-sectional view illustrating a pixel according to another alternative embodiment.

Referring to FIG. 14, such an embodiment of a display device 4 is substantially the same as an embodiment of the display device 3 described above with reference to FIG. 12 except that a second shielding layer 730 is further disposed between the second flexible substrate 103 and the second barrier layer 104.

In such an embodiment of the display device, as described above, the second shielding layer 730 may be further disposed between the second flexible substrate 103 and the second barrier layer 104. The second shielding layer 730 may include at least one material selected from the above-listed materials of the shielding layer 720. A thickness of the second shielding layer 730 may be equal or substantially similar to the thickness of the shielding layer 720.

Figure 15:
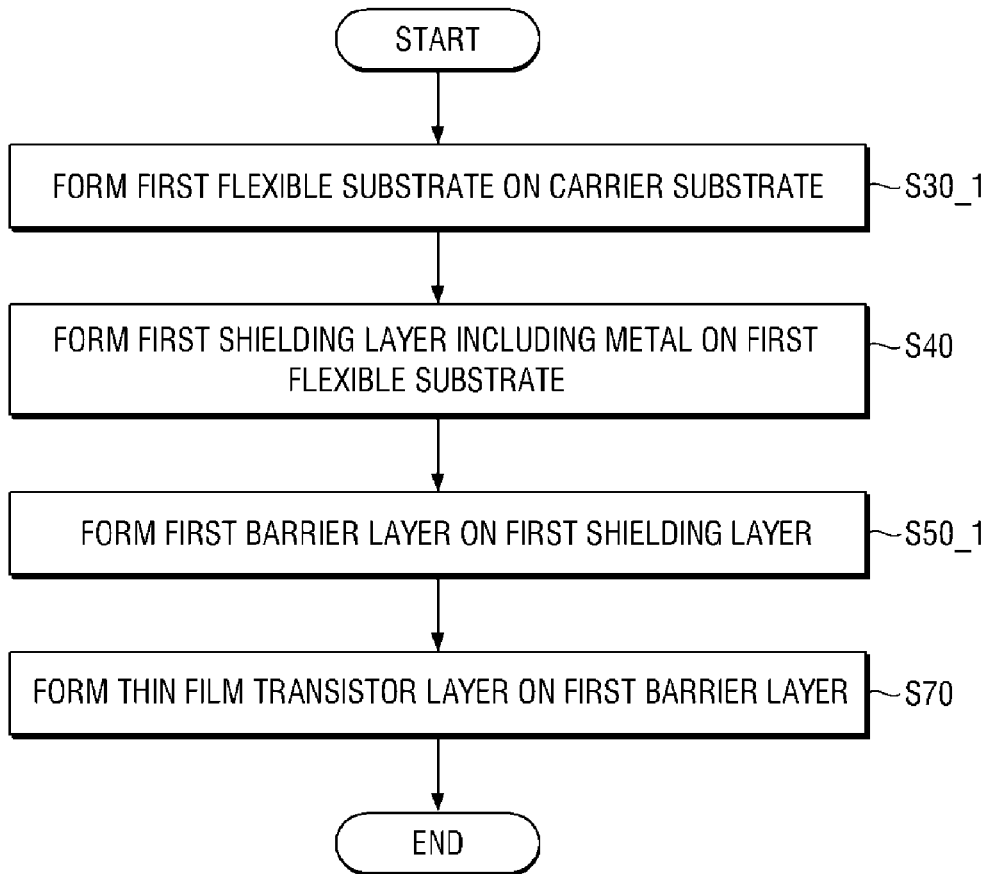
FIG. 15 is a flowchart illustrating a method of manufacturing the display device according to an alternative embodiment.
Figure 16:
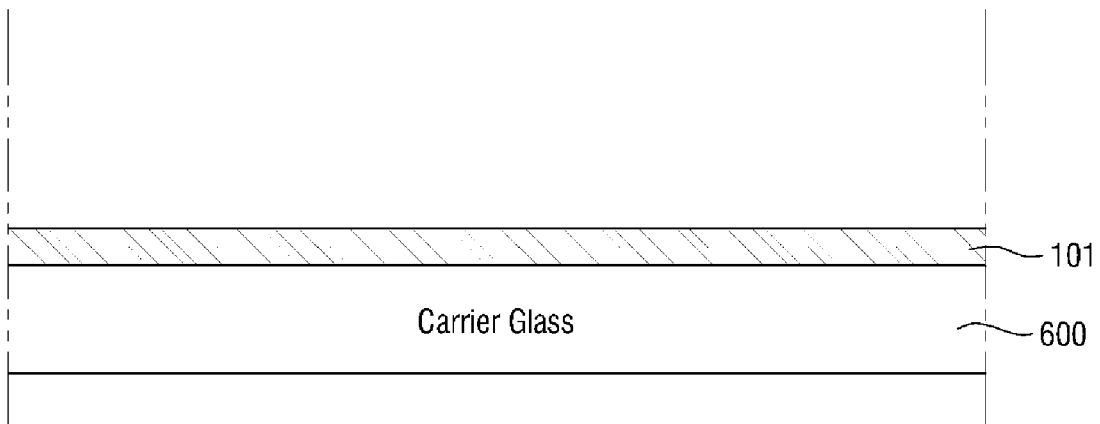
FIGS. 16 to 18 are cross-sectional views illustrating processing operations of a method of manufacturing a display device according to an alternative embodiment.
Figure 17:
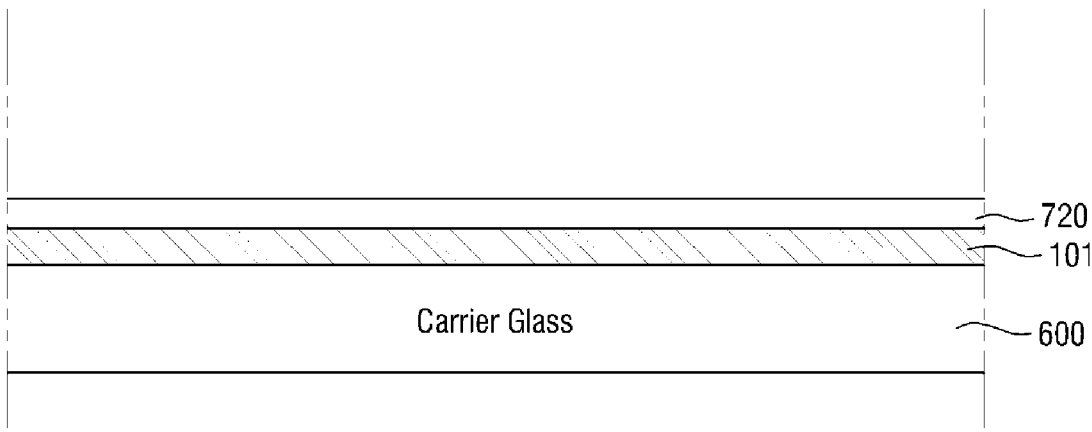
Figure 18:
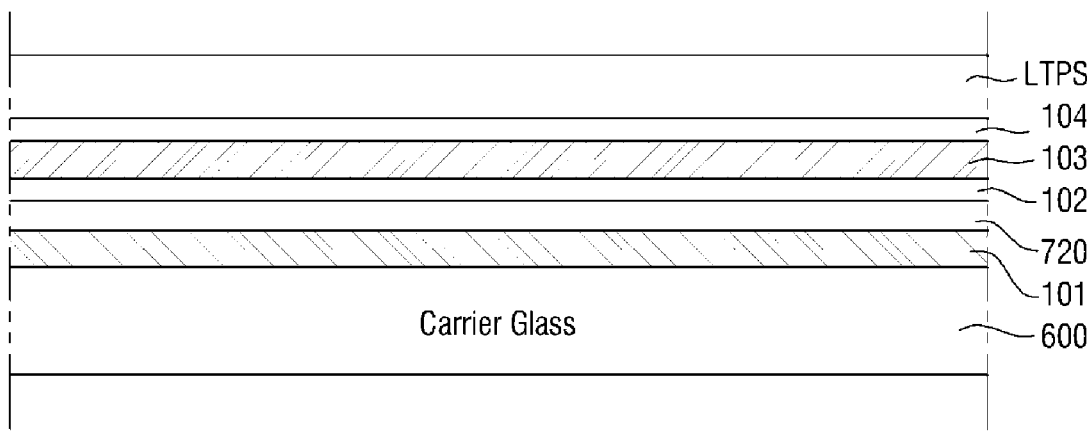
Figure 19:
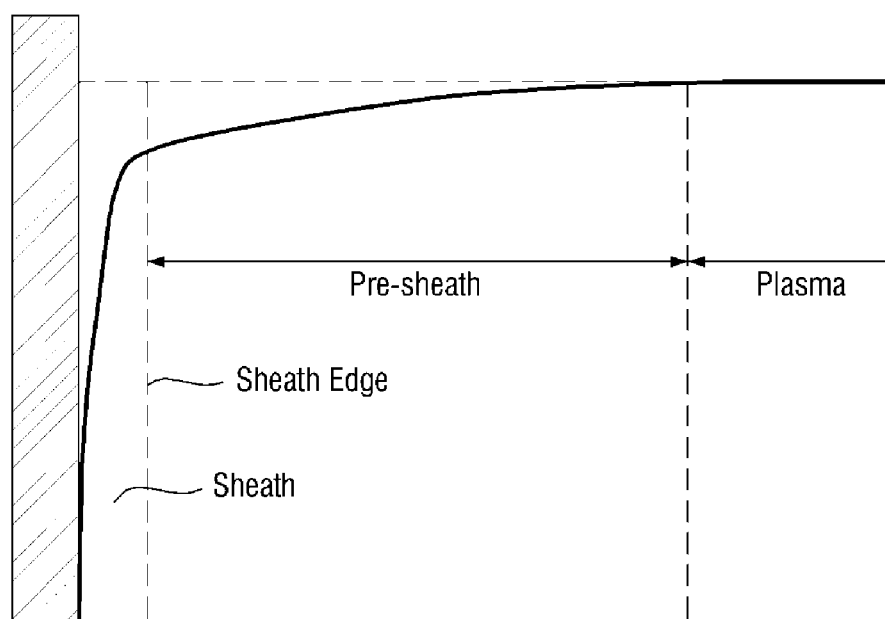
FIGS. 19 and 20 are graphs illustrating a state in which a coupling force between a flexible substrate and a carrier substrate increases during a deposition process of a barrier layer.
Figure 20:
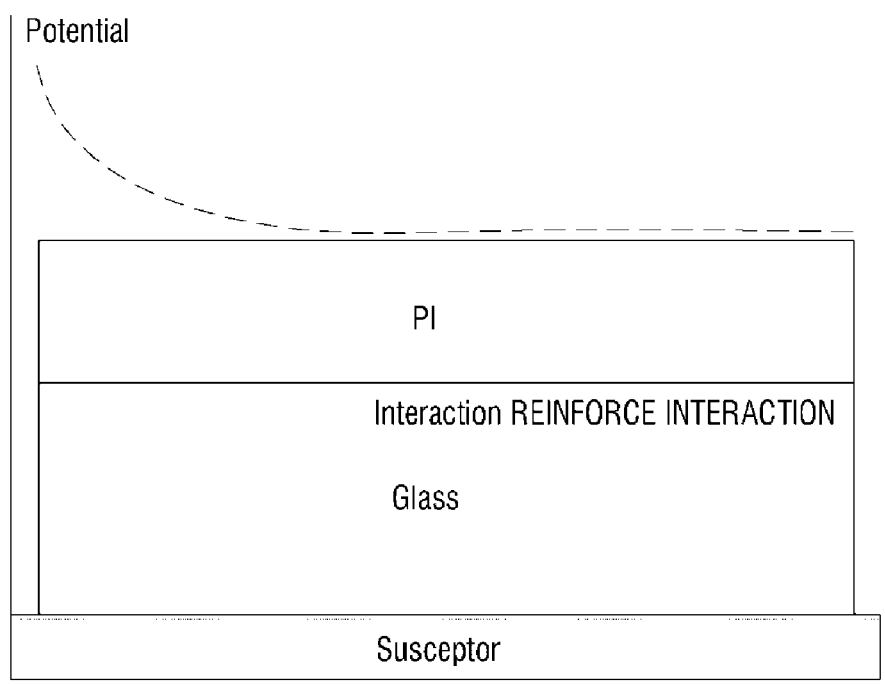
Figure 21:
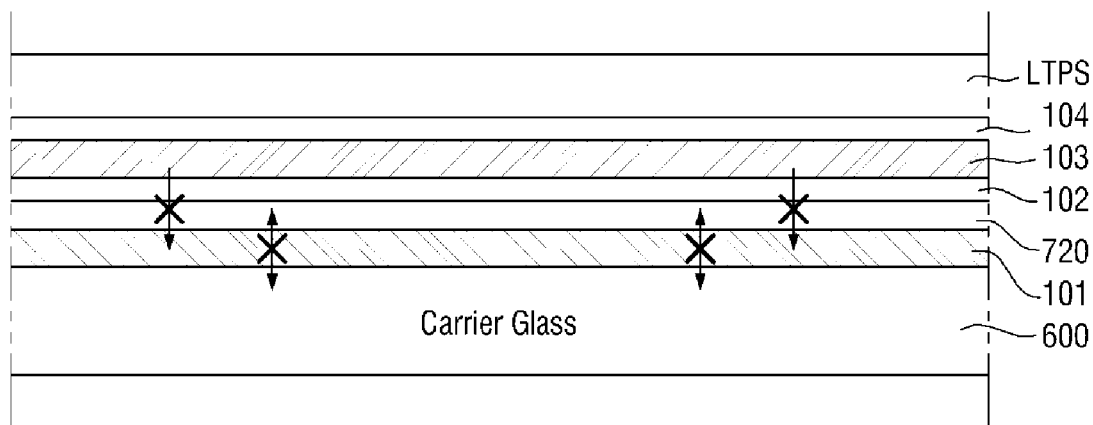
FIG. 21 is a cross-sectional view illustrating a case in which a shielding layer reduces the coupling force between the flexible substrate and the carrier substrate.

FIG. 15 is a flowchart illustrating a method of manufacturing a display device according to an alternative embodiment, FIGS. 16 to 18 are cross-sectional views illustrating processing operations of a method of manufacturing a display device according to an alternative embodiment, FIGS. 19 and 20 are graphs illustrating a state in which a coupling force between a flexible substrate and a carrier substrate increases during a deposition process of a barrier layer, and FIG. 21 is a cross-sectional view illustrating a case in which a shielding layer reduces the coupling force between the flexible substrate and the carrier substrate.

Referring to FIGS. 15 to 21, an embodiment of a method of manufacturing a display device may include providing or forming the first flexible substrate 101 on the carrier substrate 600 (S30_1), providing or forming the first shielding layer 720 including a metal on the first flexible substrate 101 (S40), providing or forming the first barrier layer 102 on the first shielding layer 720 (S50_1), and providing or forming the thin film transistor layer LTPS on the first barrier layer 102 (S70).

In such an embodiment, referring to FIG. 16, the first flexible substrate 101 is provided or formed on the carrier substrate 600 (S30_1). In such an embodiment, the method of manufacturing the display device is substantially the same as an embodiment of the method of manufacturing the display device described above with reference to FIG. 5 except that the first flexible substrate 101 is provided or formed directly on the carrier substrate 600, and any repetitive detailed description of the same or like elements thereof will be omitted.

In such an embodiment, referring to FIG. 17, the first shielding layer 720 is provided or formed on the first flexible substrate 101 (S40).

Referring to FIG. 18, subsequently, the first barrier layer 102 is provided or formed on the first shielding layer 720 (S50_1). Subsequently, the second flexible substrate 103 may be provided or formed on the first barrier layer 102 and the second barrier layer 104 may be provided or formed on the second flexible substrate 103. Subsequently, the thin film transistor layer LTPS is provided or formed on the second barrier layer 104.

Since the operation (S50_1) of forming the first barrier layer 102 is substantially the same as that of the method of manufacturing the display device described above with reference to FIG. 5 except for forming the first barrier layer 102 on the first shielding layer 720, any repetitive detailed description thereof will be omitted.

Since the operations of forming the second flexible substrate 103, the second barrier layer 104, and the thin film transistor layer LTPS as substantially the same as those described above in an embodiment of the method of manufacturing the display device, any repetitive detailed description thereof will be omitted.

Referring to FIGS. 19 to 21, in the operation (S50_1) of forming the first barrier layer 102, an electrostatic potential energy difference between the upper part and the lower part of the first flexible substrate 101 may be generated by plasma. The first barrier layer 102 may correspond to a plasma area located on a right side of a graph, the upper part of the first flexible substrate 101 may correspond to a presheath area, and the lower part of the first flexible substrate 101 may correspond to a sheath area. That is, the upper part and the lower part of the first flexible substrate 101 may have a considerable electrostatic potential energy difference therebetween. Accordingly, electrostatic attraction corresponding thereto may further increase between the lower part of the first flexible substrate 101 and the carrier substrate 600.

In an embodiment of the method of manufacturing the display device, an increase in the electrostatic attraction between the first flexible substrate 101 and the carrier substrate 600 may be effectively prevented by preventing the electrostatic potential energy difference between the upper part and the lower part of the first flexible substrate 101 from occurring due to plasma generated in the operation (S50_1) of forming the first barrier layer 102 by forming the shielding layer 720 between the first barrier layer 102 and the first flexible substrate 101 before the operation (S50_1) of forming the first barrier layer 102.

Figure 22:
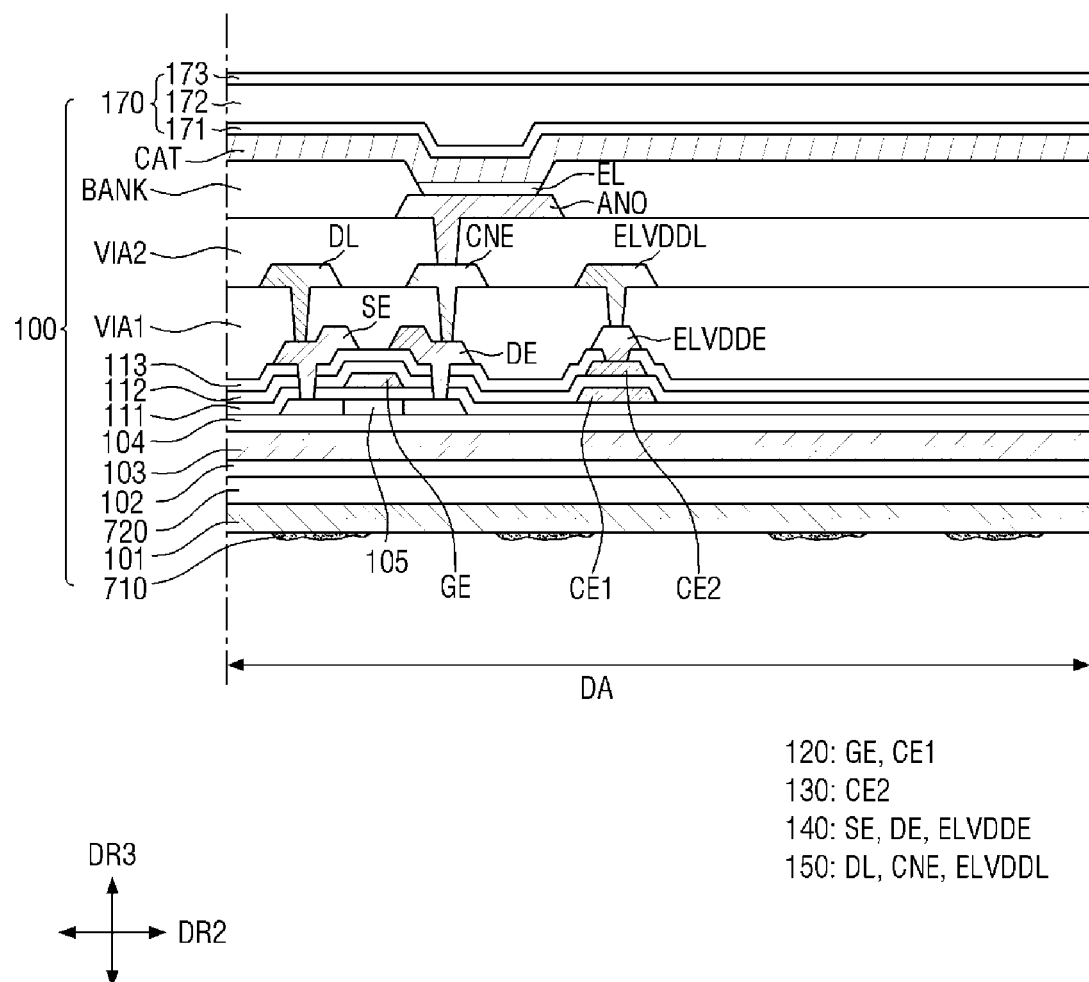
FIG. 22 is a cross-sectional view illustrating one pixel according to another alternative embodiment.

FIG. 22 is a cross-sectional view illustrating a pixel according to another alternative embodiment, and FIG. 23 is a table illustrating a coupling force between a flexible substrate and a carrier substrate according to another embodiment.

Referring to FIG. 22, in such an embodiment, a pixel of a display device is substantially the same as the embodiment described above with reference to FIG. 3 except that the shielding layer 720 described above with reference to FIG. 12 is further disposed.

In such an embodiment, the method of manufacturing the display device may include forming the inorganic layer 710a on the carrier substrate 600 (S10), forming the first flexible substrate 101 on the inorganic layer 710a (S30), forming the first shielding layer 720 including the metal on the first flexible substrate 101 (S40), forming the first barrier layer 102 on the first shielding layer 720 (S50_1), and forming the thin film transistor LTPS on the first barrier layer 102 (S70). Since such operations are substantially the same as those described above with reference to FIGS. 5 and 15, any repetitive detailed description thereof will be omitted.

Referring to FIG. 23, in a method of manufacturing the display device, when the inorganic layer 710a and the shielding layer 720 are not provided and the first barrier layer 102 is not provided on the first flexible substrate 101, a coupling force between the first flexible substrate 101 and the carrier substrate 600 is about 10 gram-force per inch (gf/inch). In this case, when the first barrier layer 102 is formed on the first flexible substrate 101, a coupling force therebetween considerably increases to about 1087.9 gf/inch, such that it may be difficult to delaminate the carrier substrate 600 from the first flexible substrate 101.

In an embodiment of the invention where the inorganic layer 710a and the shielding layer 720 are provided as described above, when the first barrier layer 102 is not formed on the first flexible substrate 101, a coupling force between the first flexible substrate 101 and the carrier substrate 600 is about 4.6 gf/inch, which is reduced considerably further than that of a case in which the inorganic layer 710a and the shielding layer 720 are not provided. In such an embodiment, it can be seen that when the first barrier layer 102 is formed on the first flexible substrate 101, a coupling force between the first flexible substrate 101 and the carrier substrate 600 is about 7.3 gf/inch which is considerably reduced further than a coupling force between the carrier substrate 600 and the first flexible substrate 101 when the inorganic layer 710a and the shielding layer 720 are not provided and the first barrier layer 102 is formed on the first flexible substrate 101.

According to an embodiment of the method of manufacturing the display device, in a process of delaminating the carrier substrate 600 from the opposing surface of the first flexible substrate 101, the carrier substrate 600 may be easily detached or delaminated directly from the opposing surface of the first flexible substrate 101 using only a mechanical detaching method without performing an operation of diminishing the coupling force between the first flexible substrate 101 and the carrier substrate 600 using ultraviolet lasers.

According to embodiments of the disclosure, a display device may have a high bonding reliability.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A method of manufacturing a display device, the method comprising:
    providing an inorganic layer on a carrier substrate;
    providing a first flexible substrate on the inorganic layer;
    providing a first shielding layer including a metal on the first flexible substrate;
    providing a first barrier layer on the first shielding layer; and
    providing a thin film transistor layer on the first barrier layer,
    wherein the inorganic layer comprises at least one material selected from silicon nitride (SiNx), silicon oxide (SiOx), and silicon oxynitride (SiOxNy), and
    wherein a thickness of the inorganic layer is in a range from about 10 Å to about 6000 Å.

2. The method of claim 1, wherein a thickness of the first shielding layer is in a range from about 10 Å to about 6000 Å.

3. The method of claim 1, wherein the inorganic layer prevents electrostatic attraction between the carrier substrate and the first flexible substrate from being generated.

4. The method of claim 3, wherein the providing the first barrier layer comprises forming the first barrier layer using plasma enhanced chemical vapor deposition.

5. The method of claim 4, further comprising:
    providing a second flexible substrate on a surface of the first barrier layer after the providing the first barrier layer and before the providing the thin film transistor layer on the first barrier layer.

6. The method of claim 5, further comprising:
    providing a second shielding layer on a surface of the second flexible substrate after the providing the second flexible substrate and before the providing the thin film transistor layer.

7. The method of claim 6, further comprising:
    providing a second barrier layer on a surface of the second shielding layer after the providing the second shielding layer on the surface of the second flexible substrate and before the providing the thin film transistor layer.

8. The method of claim 4, wherein a first coupling force between the inorganic layer and the carrier substrate is greater than a second coupling force between the first flexible substrate and the inorganic layer.

9. The method of claim 8, further comprising:
    delaminating the carrier substrate and the inorganic layer from the surface of the first flexible substrate after the providing the thin film transistor layer.

10. The method of claim 9, wherein the delaminating the carrier substrate and the inorganic layer from the surface of the first flexible substrate comprises delaminating the carrier substrate and the inorganic layer from the surface of the first flexible substrate using a mechanical detaching method.

11. A method of manufacturing a display device, the method comprising:
    providing a dipole-removing layer on a carrier substrate;
    providing a flexible substrate on the dipole-removing layer;
    providing a barrier layer on the flexible substrate; and
    providing a thin film transistor layer on the barrier layer,
    wherein the dipole-removing layer comprises an inorganic material, and
    wherein a thickness of the dipole-removing layer is in a range from about 10 Å to about 6000 Å.

12. The method of claim 11, wherein the inorganic material comprises at least one material selected from silicon nitride (SiNx), silicon oxide (SiOx), and silicon oxynitride (SiOxNy).

13. The method of claim 11, further comprising:
    delaminating the carrier substrate and the dipole-removing layer from a surface of the flexible substrate after the providing the thin film transistor layer.

14. The method of claim 13, wherein the delaminating the carrier substrate and the dipole-removing layer from the surface of the flexible substrate comprises emitting ultraviolet lasers toward the surface of the flexible substrate and removing the carrier substrate and the dipole-removing layer from the surface of the flexible substrate using a mechanical detaching method.

15. A display device comprising:
    a first flexible substrate;
    a first barrier layer disposed on a surface of the first flexible substrate;
    a thin film transistor layer disposed on a surface of the first barrier layer;
    a residue disposed on an opposing surface of the first flexible substrate; and
    a first shielding layer disposed between the first flexible substrate and the first barrier layer,
    wherein the residue comprises an inorganic material.

16. The display device of claim 15, wherein the first shielding layer comprises a metal.

17. The display device of claim 15, further comprising:
    a second flexible substrate disposed between the first barrier layer and the thin film transistor layer; and
    a second barrier layer disposed between the second flexible substrate and the thin film transistor layer.

18. The display device of claim 17, further comprising:
    a second shielding layer disposed between the second barrier layer and the second flexible substrate,
    wherein the second shielding layer comprises a metal.

19. A display device comprising:
    a first flexible substrate;
    a first barrier layer disposed on a surface of the first flexible substrate;
    a thin film transistor layer disposed on a surface of the first barrier layer; and
    a residue disposed on an opposing surface of the first flexible substrate,
    wherein the residue comprises an inorganic material,
    wherein the inorganic material comprises at least one material selected from silicon nitride (SiNx), silicon oxide (SiOx), and silicon oxynitride (SiOxNy).

* * * * *